United States Patent [19]
Burns et al.

[11] Patent Number: 5,475,920
[45] Date of Patent: Dec. 19, 1995

[54] METHOD OF ASSEMBLING ULTRA HIGH DENSITY INTEGRATED CIRCUIT PACKAGES

[76] Inventors: Carmen D. Burns, 10210 Holme-Lacey La., Austin, Travis County, Tex. 78750; Jerry M. Roane, 101 Laurelwood Dr. South, Austin, Travis County, Tex. 78733; James W. Cady, 6803 Bayridge Ter., Austin, Travis County, Tex. 78759

[21] Appl. No.: 206,311

[22] Filed: Mar. 4, 1994

Related U.S. Application Data

[63] Continuation-in-part of Ser. No. 884,066, May 15, 1992, abandoned, which is a continuation-in-part of Ser. No. 561,417, Aug. 1, 1990, abandoned.

[51] Int. Cl.[6] .................................................. H01R 43/00
[52] U.S. Cl. .............................. 29/856; 29/848; 235/488; 235/492; 437/211; 437/219
[58] Field of Search .............................. 29/825, 830, 846, 29/856

[56] References Cited

U.S. PATENT DOCUMENTS

| | | | |
|---|---|---|---|
| 2,241,493 | 5/1941 | von Thiel | 437/209 X |
| 3,436,604 | 4/1969 | Hyltin et al. . | |
| 3,614,546 | 10/1971 | Avins . | |
| 3,713,893 | 1/1973 | Shirland | 437/205 X |
| 3,739,462 | 6/1973 | Hasty . | |
| 3,746,934 | 7/1973 | Stein . | |
| 4,103,318 | 7/1978 | Schwede . | |
| 4,158,745 | 6/1979 | Keller | 174/52 FP |
| 4,222,516 | 9/1980 | Badet et al. | 235/492 |
| 4,288,841 | 9/1981 | Gogal . | |
| 4,321,418 | 3/1982 | Dran et al. | 264/102 X |
| 4,437,235 | 3/1984 | McIver | 29/840 |
| 4,451,973 | 6/1984 | Tateno et al. . | |
| 4,501,960 | 2/1985 | Jouvet et al. | 235/492 |
| 4,521,828 | 6/1985 | Fanning . | |
| 4,525,921 | 7/1985 | Carson et al. . | |
| 4,530,152 | 7/1985 | Roche et al. . | |
| 4,630,172 | 12/1986 | Stenerson et al. . | |
| 4,633,573 | 1/1987 | Scherer . | |
| 4,680,617 | 7/1987 | Ross . | |
| 4,684,975 | 8/1987 | Takiar et al. . | |
| 4,722,060 | 1/1988 | Quinn et al. | 364/490 |
| 4,733,461 | 3/1988 | Nakano | 29/830 |
| 4,763,188 | 8/1988 | Johnson . | |
| 4,796,078 | 1/1989 | Phelps, Jr. et al. . | |
| 4,821,148 | 4/1989 | Kobayashi et al. | 361/392 |
| 4,823,234 | 4/1989 | Konishi et al. | 361/386 |
| 4,829,403 | 5/1989 | Harding . | |
| 4,833,568 | 5/1989 | Berhold . | |
| 4,839,717 | 6/1989 | Phy et al. . | |
| 4,855,868 | 8/1989 | Harding . | |
| 4,862,245 | 8/1989 | Pashby et al. . | |
| 4,862,249 | 8/1989 | Carlson . | |

(List continued on next page.)

FOREIGN PATENT DOCUMENTS

| | | |
|---|---|---|
| 0298211 | 1/1989 | European Pat. Off. . |
| 340100 | 11/1989 | European Pat. Off. ............... 235/492 |
| 57-31166 | 2/1982 | Japan . |
| 58-96756 | 6/1983 | Japan . |
| 58-112348 | 7/1983 | Japan . |
| 60-180150A | 9/1985 | Japan . |
| 61-163652A | 7/1986 | Japan . |
| 61-21943 | 9/1986 | Japan ..................................... 437/211 |
| 63-187652 | 3/1988 | Japan . |
| 63-153849 | 6/1988 | Japan . |
| 63-53959 | 8/1988 | Japan . |

OTHER PUBLICATIONS

Catalog of Dense–Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870.

*Primary Examiner*—Carl J. Arbes
*Attorney, Agent, or Firm*—Fulbright & Jaworski

[57] ABSTRACT

A method and apparatus for providing a multiple-element ultra high density level-two integrated circuit modular package utilizing a temporary manufacturing fixture to achieve a stack of individual thin ultra high density integrated circuit packages.

11 Claims, 9 Drawing Sheets

U.S. PATENT DOCUMENTS

| | | | |
|---|---|---|---|
| 4,878,106 | 10/1989 | Sachs . | |
| 4,884,237 | 11/1989 | Mueller et al. | 365/63 |
| 4,888,307 | 12/1989 | Spairisano et al. | 437/216 |
| 4,891,789 | 1/1990 | Quattrini et al. | 365/63 |
| 4,948,645 | 8/1990 | Holzinger et al. | 156/252 |
| 4,953,005 | 8/1990 | Carlson et al. . | |
| 4,953,060 | 8/1990 | Lauffer et al. . | |
| 4,956,694 | 9/1990 | Eide | 387/74 |
| 4,994,411 | 2/1991 | Naito et al. | 437/217 |
| 4,997,517 | 3/1991 | Parthasarathi | 156/630 |
| 5,014,113 | 5/1991 | Casto . | |
| 5,016,138 | 5/1991 | Woodman . | |
| 5,041,015 | 8/1991 | Travis | 439/492 |
| 5,049,527 | 9/1991 | Merrick et al. | 437/220 |
| 5,057,906 | 10/1991 | Ishigami . | |
| 5,065,277 | 11/1991 | Davidson . | |
| 5,086,018 | 2/1992 | Conru et al. | 437/237 |
| 5,089,876 | 2/1992 | Ishioka . | |
| 5,099,393 | 3/1992 | Bentlage et al. . | |
| 5,108,553 | 4/1992 | Foster et al. | 29/852 |
| 5,138,430 | 8/1992 | Gow, 3rd et al. . | |
| 5,138,434 | 8/1992 | Wood et al. . | |
| 5,139,969 | 8/1992 | Mori | 437/183 |
| 5,147,822 | 9/1992 | Yamazaki et al. | 437/215 |
| 5,151,559 | 9/1992 | Conru et al. | 174/52.4 |
| 5,155,068 | 10/1992 | Tada | 437/211 |
| 5,200,362 | 4/1993 | Lin et al. | 437/207 |
| 5,214,845 | 6/1993 | King et al. | 29/841 |
| 5,223,739 | 6/1993 | Katsumata et al. | 257/676 |
| 5,264,990 | 11/1993 | Venambra | 361/761 |

METHOD OF ASSEMBLING ULTRA HIGH DENSITY INTEGRATED CIRCUIT PACKAGES

This application is a continuation-in-part of application Ser. No. 07/884,066, filed May 15, 1992, abandoned, which is a continuation-in-part of application Ser. No. 07/561,417, filed Aug. 1, 1990, abandoned.

BACKGROUND OF THE INVENTION

1. Field of Invention

This invention relates to a method and apparatus for achieving ultra high density integrated circuit packages incorporating a plurality of ultra-thin encapsulated integrated circuit packages stacked and interconnected into an ultra-high density three-dimensional module. This invention more particularly relates to the use of a temporary manufacturing fixture, or jig, to achieve three-dimensional ultra high density integrated circuit packages.

2. Discussion of the Related Art

Packaging techniques for integrated circuits have been developed in the past in an attempt to satisfy demands for miniaturization in the semiconductor industry. Improved methods for miniaturization of integrated circuits enabling the integration of millions of circuit elements into single integrated silicon embodied circuits, or chips, have resulted in increased emphasis on methods to package these circuits in space efficient, yet reliable and mass producible packages. To further enhance circuit density, it has also been proposed to package multiple units of these individual integrated circuit packages in three-dimensional stack or modules.

In manufacturing multiple-element ultra high density integrated circuit packages, it is necessary to have a reliable and cost effective method of manufacture to be competitive. To achieve reliability, the manufacturing process must be simple, quick, exact and consistent. To achieve cost reduction, it is necessary to reduce the number of steps and/or the time to manufacture these multiple-element packages. None of the prior art methods of assembly provide an efficient and reliable method suitable for mass production of three-dimensional modules.

In contrast to such prior art systems, the packaging method of the present invention provides a reliable, cost efficient, easily manufacturable package wherein a plurality of ultra thin level-one package elements are assembled in an integrated module or level-two package.

SUMMARY OF THE INVENTION

The present invention provides a manufacturing method and apparatus which enables a number of individual high density integrated circuits, or level-one packages, to be quickly and reliably stacked and assembled into a three-dimensional ultra high density integrated circuit package. This packaging technique provides an ultra high density module, or level-two package, by utilizing a temporary fixture, or manufacturing jig, in the manufacturing process. Methods of manufacturing level-two packages are described in pending patent application Serial No. 08/059,401, filed May 11, 1993, entitled "Ultra High Density Integrated Circuit Packages Method," assigned to the assignee of the present invention, which is incorporated herein by reference.

In a preferred embodiment of the present invention, a vertical stack, or level-two package, made up of a plurality of level-one high density integrated circuit packages is fabricated as a single module by utilizing a temporary manufacturing fixture, or jig. Vertically oriented, electrically and thermally conductive rails are inserted into slots, or between partitions, formed in the temporary fixture. Thereafter, a cap member is placed into the fixture and attached to the rails. The desired number and type of level-one packages are then inserted into the fixture. The temporary fixture ensures that the rails are aligned with the vertical columns of level-one package leads while the level-two package is being assembled. The entire level-two stack, including rails, cap and level-one packages, is then removed from the fixture. The stack is temporarily clamped or otherwise held securely using a clamping fixture while electrical connections between the rails and selected leads on the level-one packages are made. The entire stack is then conformal coated or otherwise bound together. The rails can be configured with SMT gull-wing leads, J-leads or otherwise depending on manufacturing or customer preference.

DETAILED DESCRIPTION OF THE PREFERRED EMBODIMENT

The invention disclosed in the parent application, Ser. No. 07/561,417, which is incorporated herein by reference, provides an integrated circuit packaging method which enables level-one high density integrated circuit packages to be packaged in transfer molded casing approximately 7 mils or less thick, encompassing an integrated circuit die element approximately eight to sixteen mils thick to produce a reliable level-one package less than thirty-two mils thick. As disclosed in the parent application, these level-one units may then be bound together mechanically or using an epoxy adhesive approximately one mil thick, with the outer surfaces of the outside level-one units having a vapor barrier such as a thin metal layer adhered thereto or deposited using known semiconductor manufacturing methods such as vacuum deposition, sputtering or the like and adhesive lamination.

Throughout this application, where it is necessary to adhere a thin film to a substrate or surface of a level-one package, the preferred adhesive materials are high-temperature, moisture resistant materials such as polyimide 111-15 from Creative Materials, Inc., thin free-base film x1-5000 available from Ablestik Laboratories, XK/5022-81C from Epoxy Technology, Inc., or other suitable adhesive material.

Figure 1:
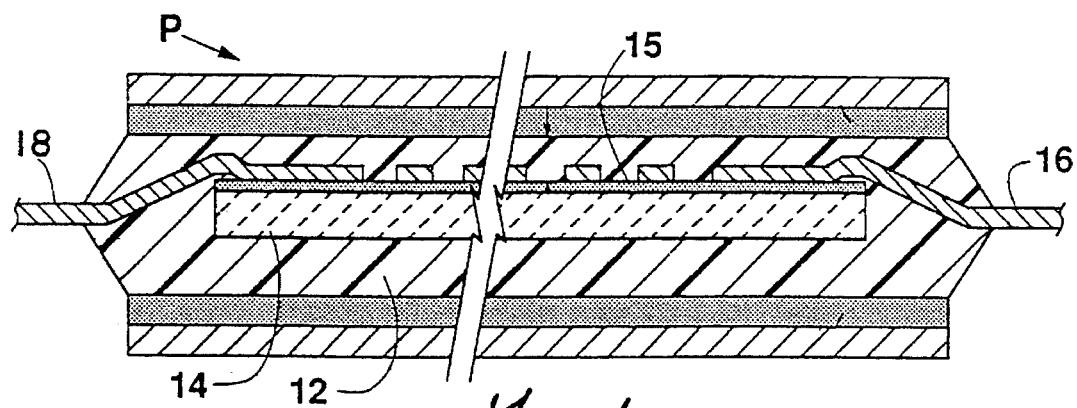
FIG. 1 illustrates the level-one design of the present invention in schematic cross-section.
Figure 2:
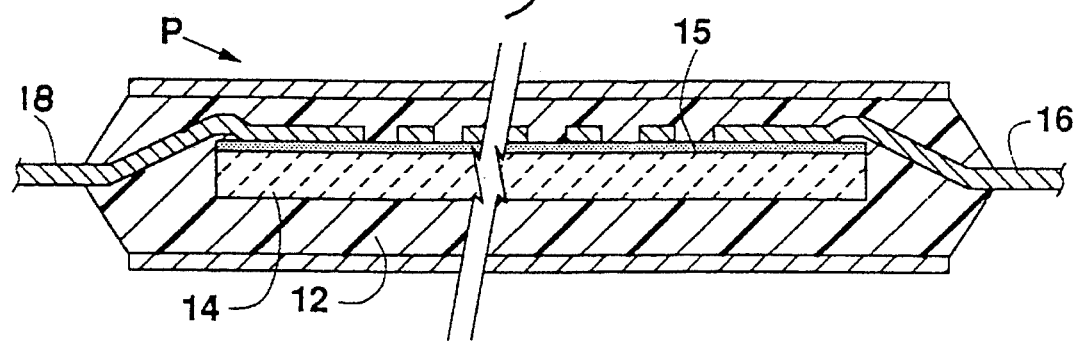
FIG. 2 illustrates an alternative embodiment of the level-one package of the present invention in schematic cross-section.

Referring now to FIGS. 1 and 2, a typical level-one package P is illustrated in cross-section. Package P comprises a transfer molded casing 12 surrounding the integrated circuit die 14, which is provided with an array of leads 16, 18 for circuit interconnection. The level-one package P is formed using conventional, proven manufacturing techniques such as transfer molding and automated tape bonding, or low-profile ribbon or wire bonding to a lead frame, yet achieves substantial reduction in thickness without sacrificing circuit integrity.

Package P in FIGS. 1 and 2 includes a silicon integrated circuit die element 14 having a nominal thickness of from about eight to about sixteen mils. Die 14 is provided with an array of conductive leads 16, 18 for circuit interconnect which are attached to die 14 in the manner described above. Leads 16, 18 are laid over a semiconductor grade epoxy insulating layer 15 which covers die 14 in a conventional manner. It should also be noted that in FIGS. 1 and 2 leads 16, 18 are illustrated as being connected at or near the edge of die 14 for clarity, whereas in automated bonding the connection pattern is more complex. It should be noted that the present invention is not limited to embodiments having leads exiting at two sides and can be readily adapted to accommodate single or four sided lead configuration, in either J-lead, gull-wing or other surface mount technology (SMT) lead configurations.

Die 14 in FIGS. 1 and 2 is encased in a transfer molded case 12 which may be formed of any suitable commercially available high-temperature semiconductor grade thermosetting plastic such as a filled NOVOLAC material. The casing material should be selected for high temperature, tolerance, moisture control, mechanical rigidity, and chemical and thermal compatibility with the silicon die 14. In the preferred embodiment, casing 12 is made of a semiconductor grade, low stress, filled, transfer molding compound including a NOVOLAC-type epoxy.

Level-Two Manufacturing

Figure 4:
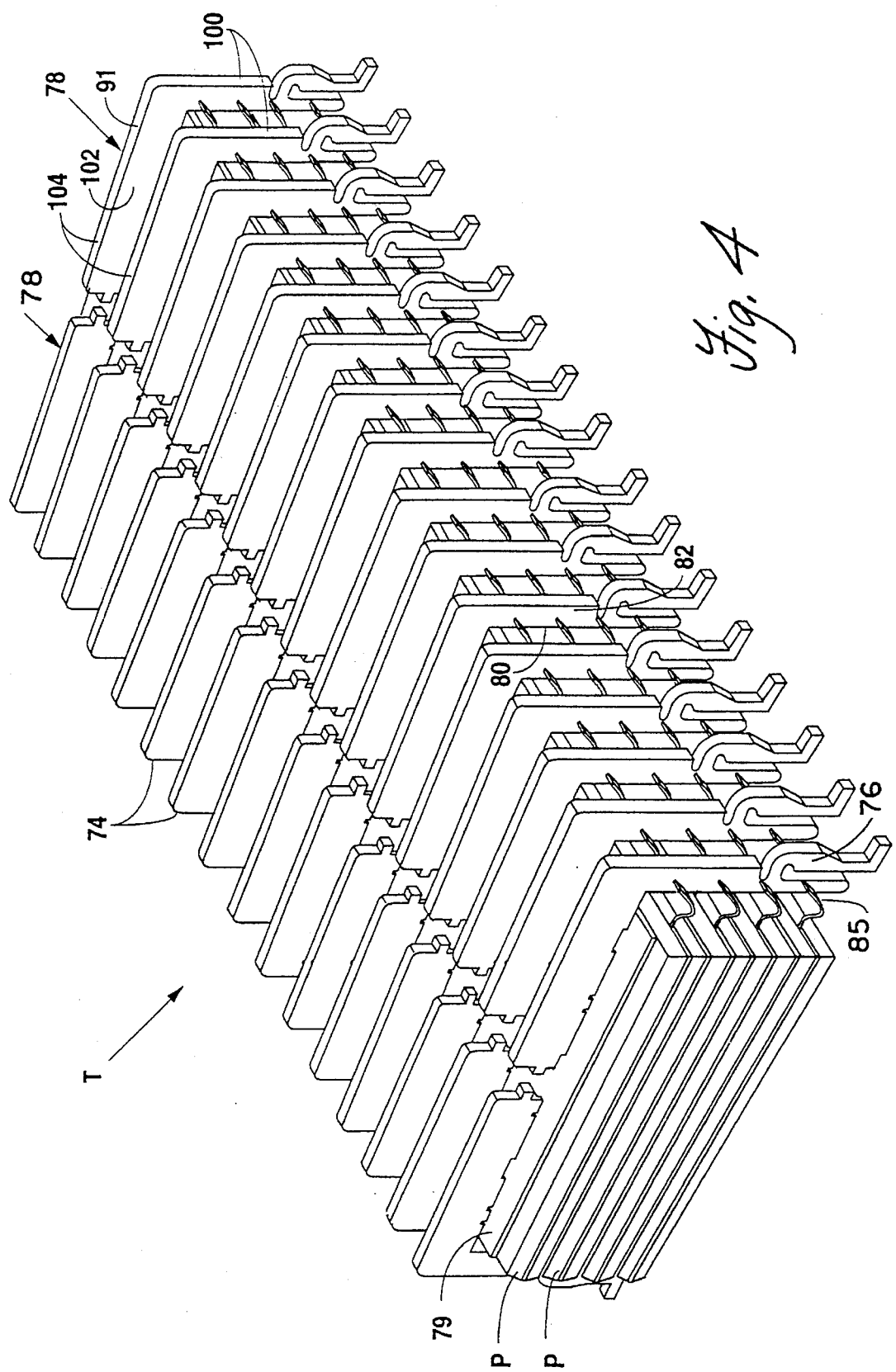
FIG. 4 is an isometric view of one embodiment of a horizontal level-two package according to the present invention.

Referring now to FIG. 4, a modular level-two package T, is formed of a plurality of stacked level-one packages P. Depending on the particular application for the module, it is sometimes desirable to selectively eliminate connections from one or more leads 85 to the level-two package rails 74. Using this method of selective connectivity, all level-one packages P are initially configured with identical lead arrays, and some are selectively removed during or prior to the assembly of the level-two package T. The unused leads are cut off (not shown) and are not part of package T. Alternatively, selective connectivity can be achieved internally to the level-one package by eliminating connections between the external leads 85 and the integrated circuit die bond pads or the like.

FIG. 4 illustrates rails 74 installed in a horizontal level-two package arrangement. Level-one packages P may be assembled into a level-two package T by any of the methods described in parent application Ser. No. 07/561,417. For example, the individual packages P are either mechanically bound together by the structural members of level-two package T or, alternatively, each level-one package P is adhered to the package immediately above and below with epoxy adhesive, with only the uppermost and lowermost level-one packages provided with an outer metal foil layer attached to the outside surfaces by an adhesive epoxy. A cap 79 may be provided between the top surface of the uppermost level-one package and rails 74 as part of the level-two package. Cap 79 is preferably attached to rails 74 with tabs as explained below.

Figure 3:
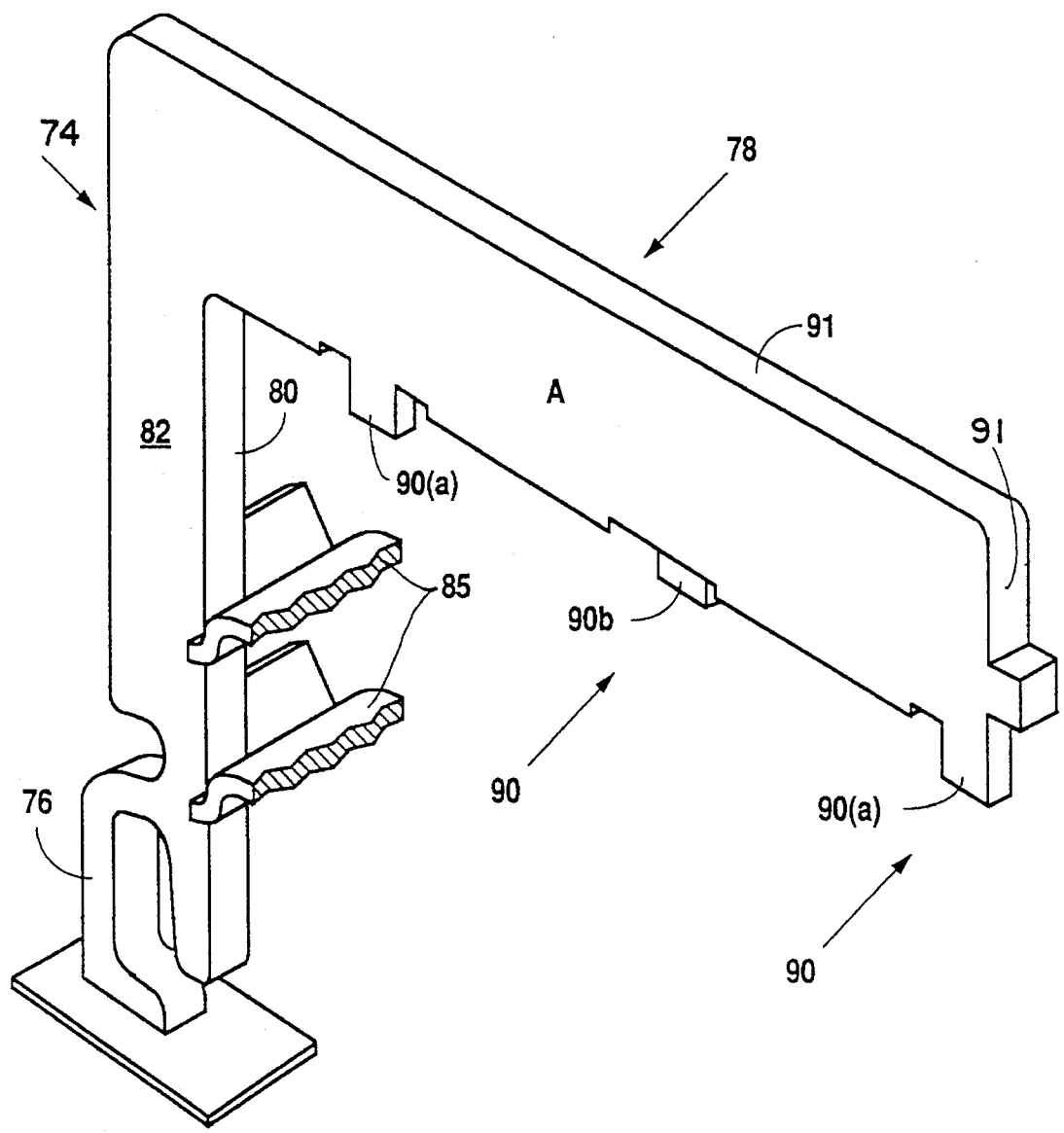
FIG. 3 is an enlarged isometric view of a rail having an extension and tabs and wherein leads are coupled to the rail in an alternative embodiment of a level-two package of the present invention.

FIG. 3 illustrates an embodiment of rail 74 which includes an extension 78. Tabs 90 are one-half the thickness of the edge 91 of rail extension 78. Note also that alternating tabs 90a and 90b, while being half the thickness of edge 91, have one side that is flush with either side A of extension 78 or side B, which is the side opposite to side A. Tabs 90a and 90b may be formed as illustrated by any suitable metal fabrication technique such as etching.

Figure 5:
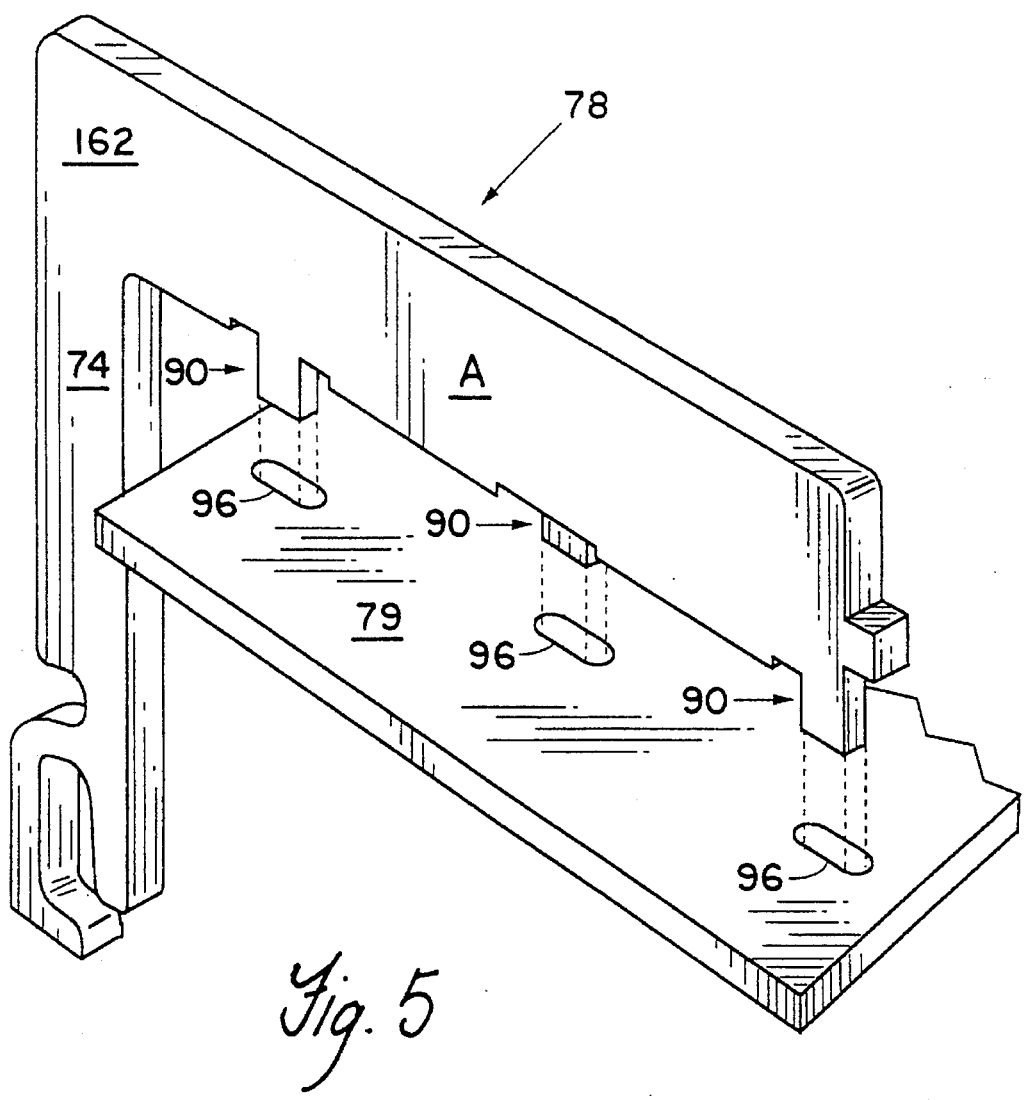
FIG. 5 is a perspective view of how the tabs of a rail are inserted into holes in a top member in accordance with the present invention.
Figure 6:
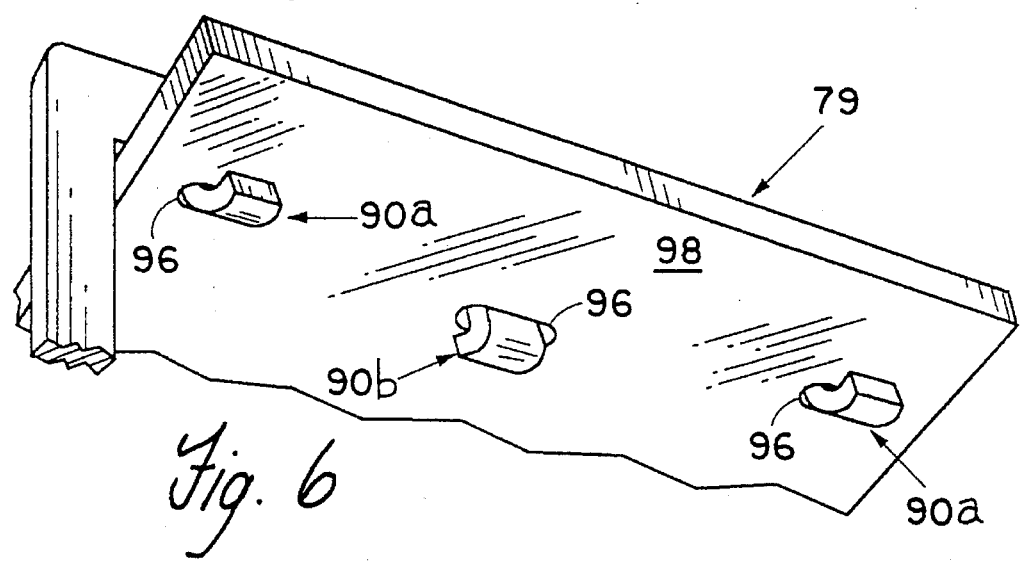
FIG. 6 is an enlarged isometric view of the tabs of a rail being bent against a top member so that the rail is secured to the top member in accordance with the present invention.

FIGS. 3–6 illustrate the function of tabs 90. FIGS. 4 and 6 illustrate rails 74 having extensions 78 coupled by their tabs 90 to cap 79. Cap 79 may be made with seven rail thick FR-4 or polyimide circuit board substrate. Holes 96 are machined in cap 79 in locations to accommodate tabs 90 of each of multiple rail 74. See FIG. 5. Tabs 90 are inserted through holes 96 and then bent over to flatten tabs 90 against surface 98 of cap 79. See FIG. 6. Since tabs 90a and 90b are half the thickness of extension 78 they bend more easily. The positioning of tabs 90a and 90b with respect to sides A and 13 of extension 78 causes these tabs to be bent in opposite directions resulting in more secured coupling between the rail extension 78 (not visible) and the cap 79. See FIG. 6. Note that in assembling the horizontal level-two package, rails 74 are assembled in a manufacturing fixture and each is coupled to cap 79 as illustrated in FIGS. 5 and 6. After this initial assembly, the stack of level-one packages are coupled with the rails and cap utilizing a manufacturing method and a temporary manufacturing fixture, or jig, as described below. A completely assembled horizontal level-two package is illustrated in FIG. 4.

Figure 9:
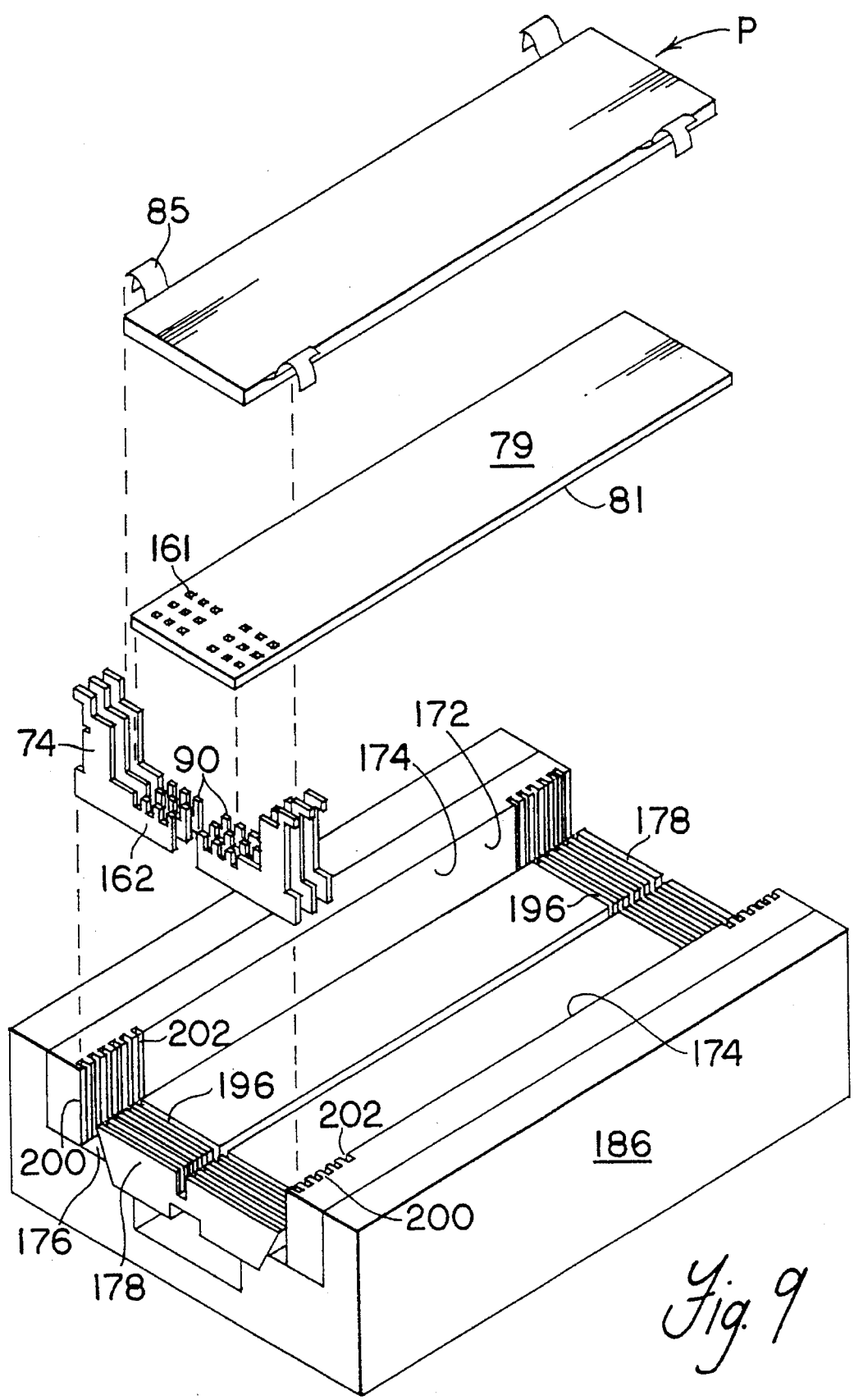
FIG. 9 is an exploded perspective view of the assembly method and temporary manufacturing fixture of the present invention.

Referring now to FIG. 9, a temporary manufacturing fixture 186, or jig, is used to fabricate a level-two module of level-one packages P. The preferred embodiment of an assembled level-two package T is shown in FIG. 4. In FIG. 9, fixture 186 is illustrated to include a floor 176, with a vertical perimeter wall 172 having at least two sides 174 extending upward from floor 176. A plurality of equally spaced vertical floor partitions 178 extend upward from floor 176 and form floor channels 196 for receiving rails 74. A plurality of equally spaced vertical wall partitions 200 extend outwardly from sides 174 of perimeter wall 172 and form wall channels 202 for receiving rails 74. Floor channels 196 and corresponding wall channels 202 are aligned with each other to allow rails 74 to be inserted down into said channels.

As shown in FIG. 9, the assembly of a level-two package T is accomplished by inserting rails 74 into fixture 186 by vertical wall partitions 200 and corresponding vertical floor partitions 178. For simplicity, only a few floor and wall partitions are illustrated in FIG. 9. In practice, the number and spacing of floor and wall partitions of the invention corresponds to the number and spacing of rails 74 for any particular configuration of module T. Vertical wall partitions 200 and floor partitions 178 are parallel to each other and equally spaced. Rails 74 are inserted upside down for mounting to cap 79. Cap 79 includes a plurality of slots 161 formed to be aligned with portions 162 of rails 74. Cap 79 is then inserted into fixture 186. The portion 162 of rails 74, which includes tabs 90, are aligned with slots 161 in cap 79.

Tabs 90 are then inserted into slots 161 and bent over. Cap 79 is thereby securely mounted to rails 74.

After this initial assembly, selected level-one packages P are then inserted down into fixture 186 so that the ends of leads 85 slide down along rails 74. It should be noted that for simplification, FIG. 9 shows only a few rails 74 and slots 161 on cap 79. Slots 161 would actually extend the length of cap 79. A pair of rails 74 would be inserted down into fixture 186 for each pair of leads 85 on packages P. Packages P may or may not be adhered or bound to one another.

Thereafter, assembly of additional level-one packages P continues until the desired level-two package T is achieved. The level-two package T is then removed from fixture 186 and secured together so it can be inserted into a clamp device 87 (shown in FIG. 10) prior to soldering. Rails 74 are then reflow soldered to leads 85 of package T by dip soldering or selective spot soldering. The entire package T is then electrically tested.

Figure 10:
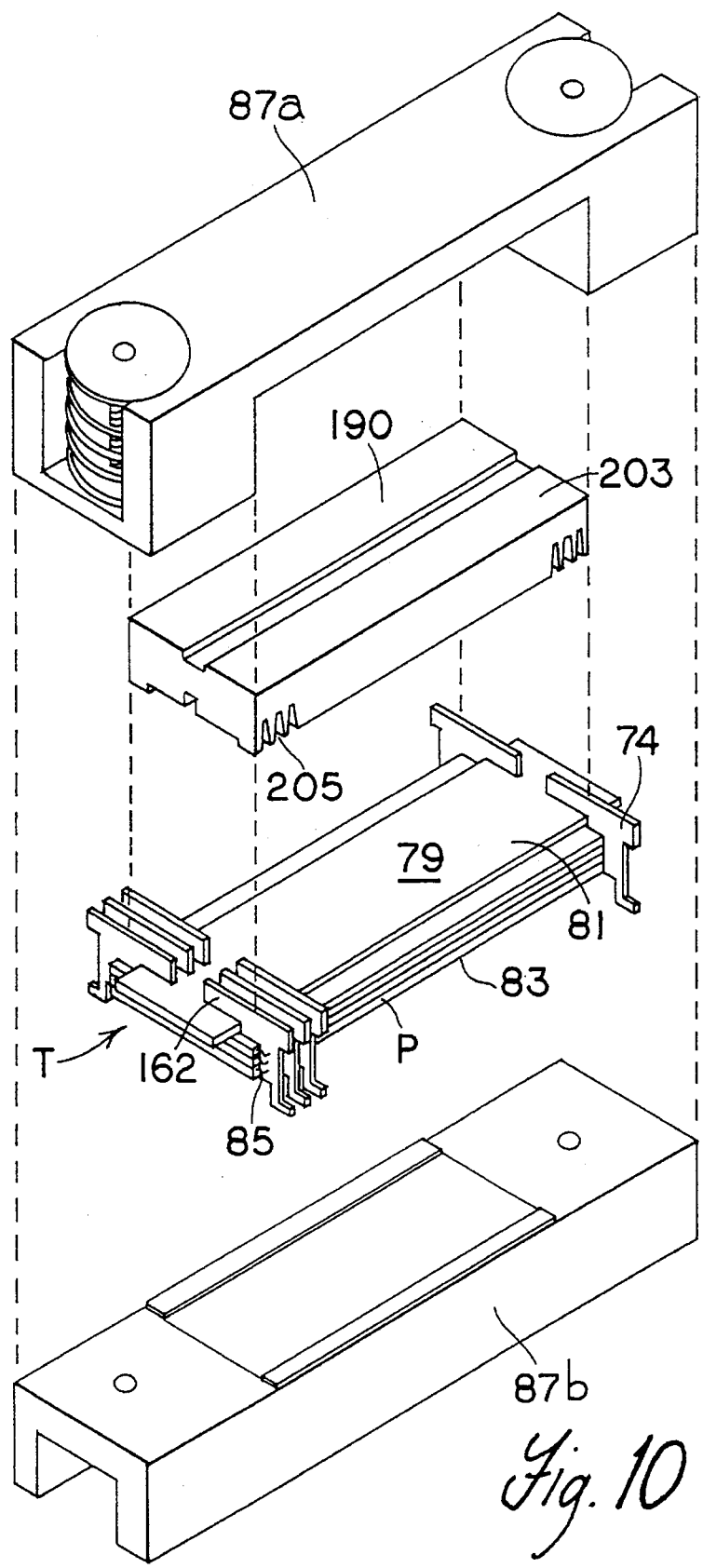
FIGS. 10 and 11 are exploded perspective views of different embodiments of the comb cap and level-two package of the present invention.
Figure 11:
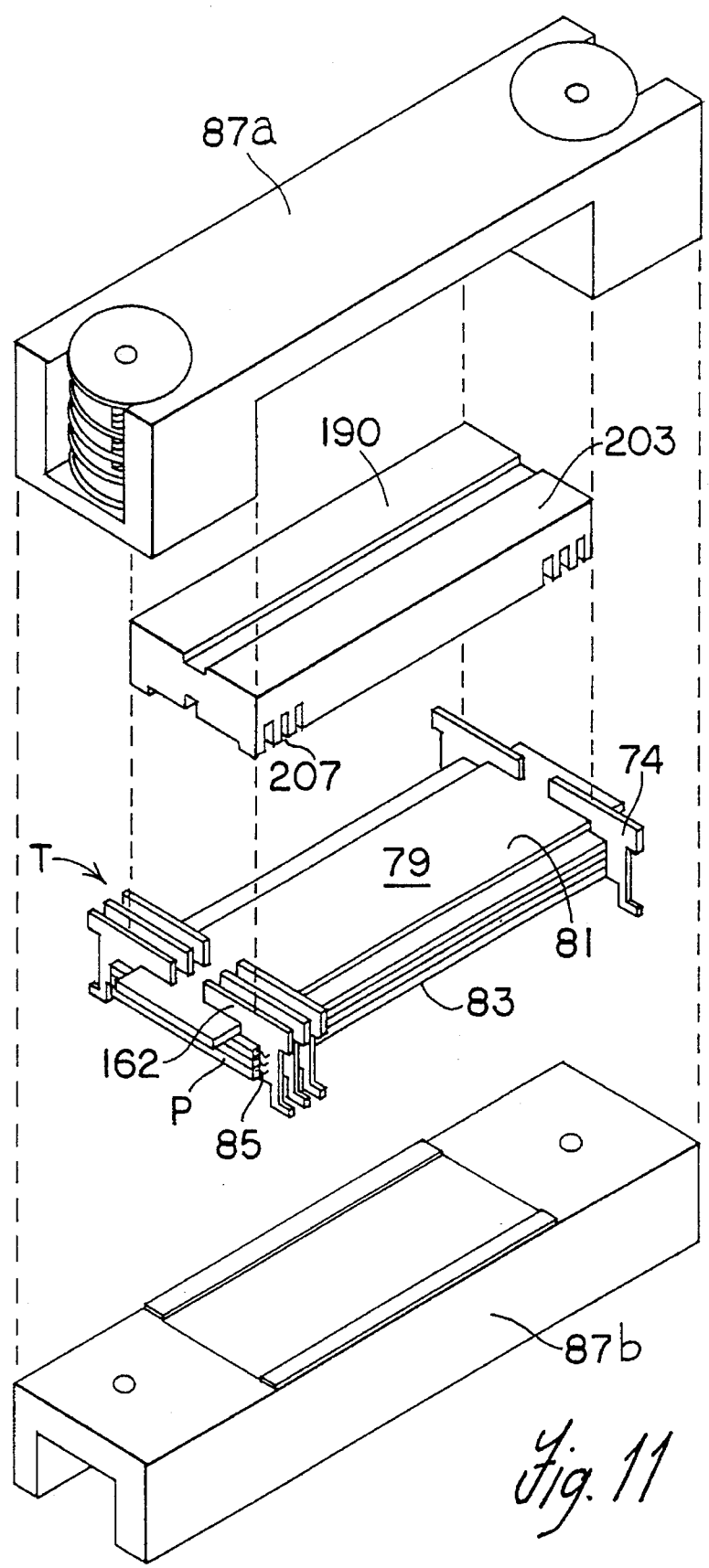

In a preferred embodiment of a method of assembling level-two packages T, after package T is removed from fixture 186 (FIG. 9), a comb cap 203 with triangularly shaped parallel grooves 205 is mounted to the top surface 81 of cap member 79 and the top portion 162 of rails 74. In another embodiment, shown in FIG. 11, rectangularly shaped parallel grooves 207 are utilized. As illustrated in FIG. 10, grooves 205 receive the top portion 162 of rails 74 and prevent damage or bending of the rails during final assembly. An upper clamp member 87a and lower clamp member 87b are adapted to receive the assembly of package T and comb cap 203. The top surface 190 of comb cap 203 provides a clamping surface for the package T which enables the assembly to be securely clamped without damaging rails 74. Clamp 87b is adapted to receive the feet of rails 74 and the lower surface 83 of package T. When joined, clamp members 87a and 87b hold package T and comb 203 to facilitate reflow soldering of the leads 85 to rails 74. After soldering, clamp 87 is released, comb cap 203 is removed from stack T, and stack T is ready for electrical testing.

Rail elements 74 are formed of conductive resilient material such as 110 alloy copper having a cross-sectional thickness in the range of four to eight-mils. Each rail element 74 (FIG. 7) comprises an intermediate lead contact portion 82 and a lower J-lead, butt-lead or gull-wing configured SMT contact portion 76.

In one embodiment, assembly and testing are conducted level by level, with each level-one package P being assembled, tested, inserted into fixture 186, and re-tested before a subsequent level-one package P is inserted and added to the stack. This methodology insures that all level-one elements are functional before subsequent elements are added to the stack to avoid waste. Where the level-one packages P have been tested prior to assembly, an entire module T can be gang soldered and tested as a unit. If a defective level-one package or connection is detected the module T can be easily disassembled and reworked provided the level-one packages P were not adhered to one another in the assembly process.

Where the stack is assembled without adhesive bonding between the level-one elements and the elements are subsequently soldered to the rails in one or more reflow process, the following procedure is utilized:

1. Assemble (including integrated circuit burn-in) and fully test a plurality of level-one packages, sorting level-one packages by speed or signal response time to ensure speed uniformity in level-two modules;

2. Insert electrically conductive rails into slots, or between partitions, of a temporary manufacturing fixture, or jig, with tabs pointed up to receive the cap;

3. Designate selected level-one packages for assembly into a particular module, or stack, by level in the stack, cutting off unused leads for each respective level-one package;

4. Insert the cap member into the temporary fixture, insert the tabs of the rails through the slits in the cap, bend over the tabs and assemble all level-one packages into the temporary fixture to form a level-two stack;

5. Place solder paste on all, or selected, level-one leads;

6. Remove the stack from the fixture;

7. Place comb cap down onto top surface of cap member and top portion of rails so that triangular slots in comb cap receive top portion of rails therein;

8. Clamp, or otherwise hold the stack together, by clamping upper portion of comb cap and bottom surface of bottommost level-one package in the level-two stack so leads can be electrically connected to the rails;

9. Reflow solder all, or selected, level-one leads to the rails in one reflow process, or one side of the stack at a time;

10. Remove comb cap;

11. Test entire level-two stack;

12. If defective, remove the cap, desolder and remove the defective level-one package(s) from the stack, replace the defective unit(s) and rework the assembly (stages 1 through 11). As previously noted, step 3 above can also be accomplished by selectively connecting/disconnecting interior electrical connections between the integrated circuit die and bond pads or between pads and the leads that extend out of the casing of the level-one packages P during the manufacturing process of the level-one packages.

Figure 7:
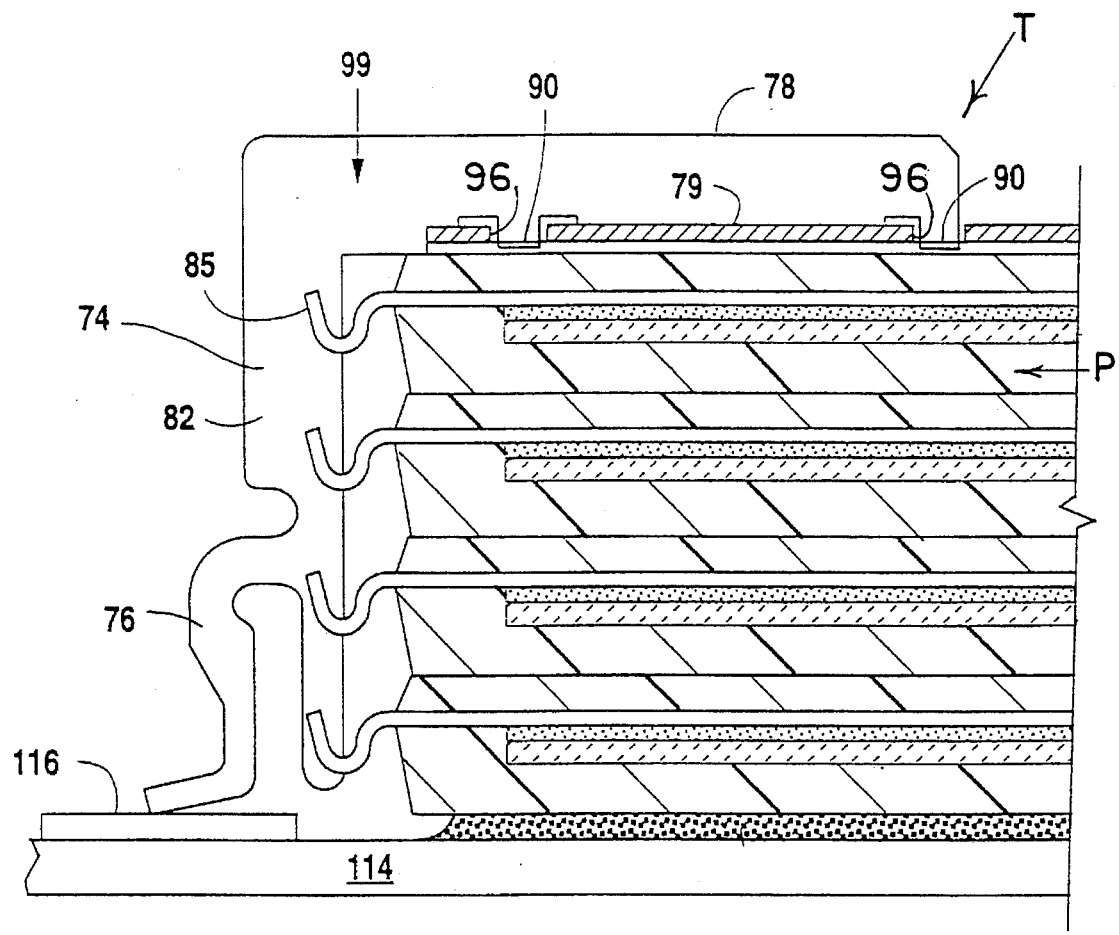
FIGS. 7 and 8 are cross-sectional views of a horizontal level-two package affixed to a circuit board substrate by alternative embodiments in accordance with the present invention.
Figure 8:
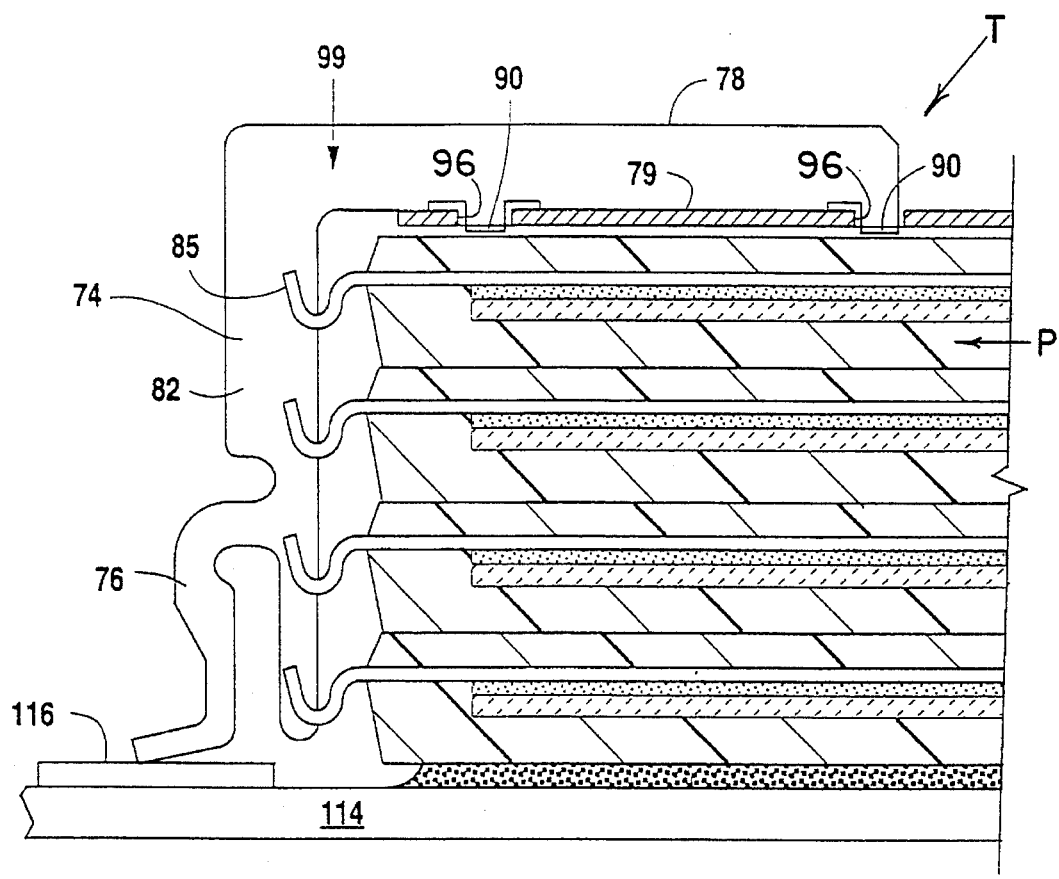

FIG. 7 illustrates a cross-sectional side view of an assembled level-two package wherein the rail extension 78 is provided with a shoulder 99 which rests flush with the uppermost level-one package P. Shoulder 99 helps keep the rail extension 78 and the bent tabs 90 in their desired positions, and thereby prevents possible electrical shorting from the uppermost level-one package P to the bent tabs.

Referring now to FIG. 3, the electrical and thermal connections between rails 74 and leads 85 is illustrated in detail. Coupling the edge 80 of rails 74 to leads 85 causes the side 82 of the rails to extend outwardly from the stack of level-one packages P so as to form multiple fins 100. (See FIG. 4.) Furthermore, rail extensions 78 also act as fins for heat dissipation. As discussed above, extensions 78 have tabs 90 which extend from the bottom of the edge 91 for coupling with cap 79. When extensions 78 are coupled to cap 79 in this arrangement, the side of extensions 78 that is wider than edge 91, indicated by reference numeral 102, extends upwardly away from the cap and acts as a fin. Multiple rail extension fins are designated by reference numeral 104. Fins 100 and 104 provide heat dissipation away from the horizontal level-two package T when air is circulated across the fins. Fins 100 and 104 thus act as heat sinks. It should be appreciated that the positioning of fins 100 and fins 104, such as their angle, can be adjusted to accommodate space limitations on the sides and tops of horizontal level-two package T and the direction of air circulation.

FIG. 7 illustrates how the level-two package T may be mounted to a circuit board substrate. FIG. 7 illustrates that circuit board substrate mounting portion 76 of rail 74 is soldered to contacts 116 of circuit board substrate 114. The J-lead configuration in FIG. 7 provides easier access to the solder securing the mounting portion 76 to contact 116.

The foregoing description provides details of preferred embodiments of a method of assembling level-one packages into a high density level-two package and an apparatus used to perform such assembly. The disclosure and description of the present invention are illustrative and explanatory of the preferred embodiments, and changes in the size, shape, materials and individual components, circuit elements, connections and construction may be made without departing from the spirit of the invention.

What is claimed is:

1. A method of manufacturing an ultra high density integrated circuit package, comprising the steps of:
   (a) providing a plurality of level-one integrated circuit packages of the type including an integrated circuit element formed in a silicon substrate, and a casing surrounding said integrated circuit element, said casing having an upper and a lower surface and a perimeter wall; and
   wherein said integrated circuit element includes a plurality of electrical interconnect leads extending from said silicon substrate through a portion of said perimeter wall;
   (b) providing a temporary fixture for receiving a plurality of electrically conductive rails adapted for electrical connection to said leads extending from said level-one packages;
   (c) inserting said rails into said temporary fixture;
   (d) mounting a cap member to said rails;
   (e) inserting a plurality of level-one packages into said fixture to form a stack, wherein said leads of said level-one packages are aligned with said rails;
   (f) extracting said stack from said fixture; and
   (g) electrically connecting at least some of said leads to said rails.

2. The method of claim 1, further comprising the step of clamping the assembled stack together prior to making said electrical connections.

3. A method of manufacturing an ultra high density integrated circuit package, comprising the steps of:
   (a) providing a plurality of level-one integrated circuit packages of the type including an integrated circuit element formed in a silicon substrate, and a casing surrounding said integrated circuit element, said casing having an upper and a lower surface and a perimeter wall; and
   wherein said integrated circuit element includes a plurality of electrical interconnect leads extending from said silicon substrate through a portion of said perimeter wall;
   (b) providing a temporary fixture for receiving a plurality of electrically conductive rails adapted for electrical connection to said leads extending from said level-one packages;
   (c) inserting said rails into said temporary fixture;
   (d) mounting a cap member to said rails in said fixture;
   (e) inserting a first level-one package into said fixture;
   (f) repeating step (e) for second and subsequent level-one packages so that a stack of level-one packages is formed;
   (g) extracting said stack of level-one packages from said temporary fixture;
   (h) securing said stack together; and
   (i) electrically connecting at least some of said leads of said level-one packages to said rails.

4. The method of claim 3, wherein said step of securing said stack together is accomplished by clamping.

5. The method of claim 3, further comprising the step of applying flux to said rails and at least some of said leads prior to forming electrical connections.

6. The method of claim 3, wherein said step of electrically connecting at least some of said leads in said stack is accomplished by dip soldering at least some of said leads to said rails.

7. The method of claim 6, wherein said stack is dip soldered one side at a time.

8. The method of claim 3, further comprising the step of applying a conformal coating to a portion of said stack to bind level-one packages together.

9. The method of claim 3, wherein said step of mounting a cap member to said rails is accomplished by inserting tabs formed on an upper portion of said rails into slots formed in said cap member and then bending said tabs to secure said cap to said rails.

10. The method of claim 3, further comprising the step of mounting a comb cap having triangular grooves to said cap member, wherein said grooves are adapted to receive said rails within said triangular grooves, and wherein said stack is then secured together by a clamp in contact with the bottom of said stack and the top of said comb cap.

11. The method of claim 3, wherein said step of securing the stack includes the steps of mounting a comb cap having rectangular grooves to the assembly comprised of the rails, the cap member and the level-one packages, said comb cap grooves receiving and holding a portion of said rails.

* * * * *